(12) United States Patent
Roca I Cabarrocas et al.

(10) Patent No.: US 8,383,210 B2
(45) Date of Patent: Feb. 26, 2013

(54) METHOD OF FORMING A FILM BY DEPOSITION FROM A PLASMA

(75) Inventors: Pere Roca I Cabarrocas, Villebon sur Yvette (FR); Pavel Bulkin, Villebon sur Yvette (FR); Dmitri Daineka, Palaiseau (FR); Patrick Leempoel, Brussels (BE); Pierre Descamps, Rixensart (BE); Thibault Kervyn De Meerendre, Brussels (BE)

(73) Assignees: Dow Corning Europe S.A., Seneffe (BE); Ecole Polytechnique, Palaiseau (FR)

( * ) Notice: Subject to any disclaimer, the term of this patent is extended or adjusted under 35 U.S.C. 154(b) by 331 days.

(21) Appl. No.: 12/447,615

(22) PCT Filed: Oct. 26, 2007

(86) PCT No.: PCT/EP2007/009306
§ 371 (c)(1),
(2), (4) Date: Apr. 28, 2009

(87) PCT Pub. No.: WO2008/052706
PCT Pub. Date: May 8, 2008

(65) Prior Publication Data
US 2010/0047473 A1   Feb. 25, 2010

(30) Foreign Application Priority Data
Nov. 2, 2006 (EP) .................................. 06301118

(51) Int. Cl.
*C23C 16/511* (2006.01)
(52) U.S. Cl. ....................................... 427/575; 427/578
(58) Field of Classification Search .................. None
See application file for complete search history.

(56) References Cited

U.S. PATENT DOCUMENTS

| | | | | |
|---|---|---|---|---|
| 5,130,170 A | * | 7/1992 | Kanai et al. | 427/575 |
| 5,204,272 A | * | 4/1993 | Guha et al. | 438/96 |
| 5,231,048 A | * | 7/1993 | Guha et al. | 438/485 |
| 5,429,685 A | | 7/1995 | Saito et al. | |
| 5,536,914 A | | 7/1996 | Pelletier et al. | |
| 5,666,023 A | | 9/1997 | Pelletier et al. | |
| 5,739,043 A | * | 4/1998 | Yamamoto | 438/535 |

(Continued)

FOREIGN PATENT DOCUMENTS

| | | |
|---|---|---|
| EP | 0233613 | 8/1987 |
| EP | 0487114 | 5/1992 |

(Continued)

OTHER PUBLICATIONS

Layadi, Phys. Rev B, V52, 1995, p. 5136.*

(Continued)

*Primary Examiner* — Joseph Miller, Jr.
(74) *Attorney, Agent, or Firm* — Leason Ellis LLP

(57) ABSTRACT

A method is described of depositing film of an amorphous or microcrystalline material, for example silicon, from a plasma on to a substrate. Microwave energy is introduced into a chamber as a sequence of discrete microwave pulses, a film precursors gas is introduced into the chamber as a sequence of discrete gas pulses, and gas for generating atomic hydrogen is supplied to the chamber at least during each microwave pulse. Each microwave pulse is followed in non-overlapping fashion with a precursor gas pulse, and each precursor gas pulse is followed by a period during which there is neither a microwave pulse nor a precursor gas pulse.

15 Claims, 1 Drawing Sheet

U.S. PATENT DOCUMENTS

| | | | | |
|---|---|---|---|---|
| 5,980,999 | A * | 11/1999 | Goto et al. | 427/572 |
| 6,372,303 | B1 * | 4/2002 | Burger et al. | 427/569 |
| 6,407,359 | B1 | 6/2002 | Lagarde et al. | |
| 2002/0022349 | A1 | 2/2002 | Sugiyama et al. | |
| 2002/0127764 | A1 * | 9/2002 | Lohmeyer et al. | 438/89 |
| 2003/0176011 | A1 * | 9/2003 | Niira et al. | 438/96 |
| 2003/0183169 | A1 * | 10/2003 | Ueda et al. | 118/723 I |
| 2003/0194508 | A1 | 10/2003 | Carpenter et al. | |
| 2004/0247948 | A1 | 12/2004 | Behle et al. | |

FOREIGN PATENT DOCUMENTS

| | | |
|---|---|---|
| EP | 1075168 | 2/2001 |
| GB | 2083701 | 3/1982 |
| JP | 1-149965 | 6/1989 |
| JP | 3-261136 | 11/1991 |
| JP | 05314918 | 11/1993 |
| JP | 7-263353 | 10/1995 |
| JP | 10081968 | 3/1998 |
| JP | 2001-516947 | 10/2001 |
| WO | WO-2008/052703 | 5/2008 |
| WO | WO-2008/052704 | 5/2008 |
| WO | WO-2008/052705 | 5/2008 |
| WO | WO-2008/052707 | 5/2008 |
| WO | WO-2008/052708 | 5/2008 |
| WO | WO-2008/053271 | 5/2008 |

OTHER PUBLICATIONS

Saitoh, Appl. Phys Lett., V71, No. 23, Dec. 1997, p. 3403-5.*

Daineka, D., et al., "Control and Monitoring of Optical Thin Films Deposition in a Matrix Distributed Electron Cyclotron Resonance Reactor," European Physical Journal, Applied Physics EDP Sciences France, vol. 28, No. 3, Dec. 2004, pp. 343-346.

Daineka, D., et al., "High density plasma enhanced chemical vapour deposition of thin films" European Physical Journal—Applied Physics, vol. 26, No. 1, Apr. 2004, pp. 3-9, XP002462386.

"Compact Microwave Plasma Source" IBM Technical Disclosure Bulletin, IBM Corp. New York, US, vol. 35, No. 5, Oct. 1, 1992, pp. 307-308, XP000312985 ISSN; 0018-8689.

Bulkin, P., et al., "Plasma enhanced chemical vapour deposition of silica thin films in an integrated distributed electron cyclotron resonance reactor" Preparation and Characterization, Elsevier Sequoia, NL, vol. 308-309, Oct. 31, 1997, pp. 63-67, XP004524338 ISSN: 0040-6090.

Jes Asmussen jr et al: "The Design and Application of Electron Cyclotron Resonance Discharges" IEEE Transactions on Plasma Science, IEEE Service Centre, Piscataway, JN, US, vol. 25, No. 6, Dec. 1997, XP011044935 ISSN: 00933813.

Bechu S et al: "Multi-dipolar plasmas for plasma-based ion implantation and deposition" Surface & Coatings Technology Elsevier Switzerland, vol. 186, No. 1-2, Aug. 2, 2004, pp. 170-176, XP0024261912 ISSN: 0257-8972.

Bardos L et al: "Microwave Surfatron Systems for Plasma Processing" Journal of Vacuum Science and Technology: Part A, AVS/AIP, Melville, NY, US, vol. 14, No. 2, Mar. 1, 1996, pp. 474-477, X000620528 ISSN: 0734-2101.

Bulkin P et al: "Deposition of silicon alloys in an integrated distributed electron cyclotron resonance reactor: Oxide, nitride, oxinitrides, and multilayer structures" Journal of Vacuum Science and Technology A.Vacuum, Surfaces and Films, American Institute of Physics, New York, NY, US, vol. 20, No. 2, Mar. 2002, pp. 338-343, PX012005960 ISSN: 0734-2101.

Girard G et al, "Matrix-distributed ECR-PECVD for high-rate deposition of silica for applications in integrated optics" Proceedings of the SPIE—The International Society for Optical Engineering SPIE—Int. Soc. Opt. ENG USA, vol. 4944, 2003, pp. 62-71, PX002436134 ISSN: 0277-786X.

Shing Y H et al: "Electron Cyclotron Resonance Microwave Plasma Deposition of A-SI:H and ASIC: H Films" Solar Cells, Elsevier Sequoia SA, Lausanne, CH, vol. 30, No. 1/4, May 1, 1991, pp. 391-401, XP000243420.

Plais F et al: "Low Temperature Deposition of SIO2 by Distributed Electron Cyclotron Resonance Plasma-Enhanced Chemical Vapor Deposition" Journal of the Electrochemical Society, Electrochemical Society, Manchester, New Hampshire, US, vol. 139, No. 5, May 1, 1992, pp. 1489-1495, XP000355387ISSN: 0013-4651.

Lagarde, T, et al., "Determination of the EEDF by Langmuir Probe diagnostic in a plasma excited at ECR above a multipolar magnetic field", Plasma Sources Sci. Technol. 10, 181-190, 2001.

Moisan & Pelletier, "Microwave Excited Plasmas,"Elsevier, 1992, Appendix 9.1 pp. 269-271.

Fontcuberta, A., et al., "Structure and hydrogen content of polymorphous silicon thin films studied by spectroscopic ellipsometry and nuclear measurements" Physical Review B 69,125307/1-10, 2004.

Rafat, N. et al., "The limiting efficiency of band gap graded solar cells" Solar Energy Materials & Solar Cells, 55(1998) 341-361.

Foelsch, J., et al., Conference Record of the IEEE Photovoltaic Specialists Conference (1996) 25th 133-1136.

Dalal, V. et al., "Improvements in stability of a-silicon solar cells through the use of band gap grading" Conference Record of IEEE Photovoltaic Specialists Conference (1993), 23rd 806-20.

Suzuki et al, "Radio-frequency biased microwave plasma etching technique: A method to increase SiO2 etch rate", J Vac. Sci. Technol. B 3(4), 1025-1033, Jul./Aug. 1985.

Sakudo, N., et al., "Development of Hybrid Pulse Plasma Coating System," Surface and Coatings Technology Elsevier Switzerland, vol. 136, No. 1-3, Feb. 2, 2001, pp. 23-27.

Awazu, K., et al., "Films Formed by Hybrid Pulse Plasma Coating (HPPC) System," AIP Conference Proceedings AIP USA, No. 576, 2001, pp. 955-958.

Itagaki N. et al., Plasma parametermeasurements and deposition of a-Si: H thin films in pulsed ECR plasma, Surface and Coatings Technology, 2000, vol. 131, No. 1/3, pp. 54-57.

Lee Ju-Hyeon et al., Effect of microwave pulse on the optical properties of hydrogenated amorphous silicon thin films deposited by electron cyclotron resonance plasma, Japanese Journal of Applied Physics, 1997, vol. 36, No. 11, pp. 6867-6870.

Neitzert H. C. et al., In situ thickness control during plasma deposition of hydrogenated amorphous silicon films by time-resolved microwave conductivity measurements, Applied Optics, 1995 1 vol. 34, No. 4, pp. 676-680.

Hori Naoki et al., Forming Microcrystalline Silicon Film at Low Temperature Using Pulse Modulated UHF SiH4/H2 Pulse Plasma, Japan Society of Applied Physics Scholarly Presentation Lecture Proceedings, 2004, vol. 65, No. 1, p. 369.

* cited by examiner

METHOD OF FORMING A FILM BY DEPOSITION FROM A PLASMA

CLAIM OF PRIORITY

This application is a U.S. national phase application under 35 U.S.C. §371 of International Patent Application No. PCT/EP2007/009306 filed Oct. 26, 2007, and claims the benefit of priority of EP Patent Application No. 06301118.3 filed Nov. 2, 2006, the disclosures of all of which are hereby incorporated by reference in their entireties. The International Application was published in English on May 8, 2008 as WO 2008/052706.

This invention relates to a method for forming a film by deposition from a plasma on to a work surface. More particularly, it concerns the use of microwave energy to produce the plasma by electron cyclotron resonance. One area of particular interest is in depositing a film of amorphous silicon (a-Si:H) by dissociation of a silane, for example $SiH_4$, $Si_2H_6$ or a higher order of oligomer, in a process known as plasma-enhanced CVD (chemical vapor deposition). Other precursor gases which can be used to deposit amorphous silicon, or amorphous silicon alloys, include molecules in which silicon is present in combination with one or more of carbon, oxygen, or nitrogen, optionally together with hydrogen. An example of a silicon alloy is a structure of the type denoted by $SiO_xN_y$. Further, silicon-containing gases may be used together with other gases, for example germane, or gases not containing silicon may be used to deposit other films. One area of particular interest as regards the use of amorphous silicon films is in devices for converting solar energy into electrical power. Such amorphous silicon material can also find use in electronic applications such as TFT for display. As used herein, the term "amorphous silicon" denotes hydrogenated amorphous silicon, a-Si:H. For use in the areas just mentioned, some hydrogen must be present, typically 3-20%, to passivate the dangling bonds which are defects.

To favour the deposition of high quality silicon film at low temperature, it is desirable to promote the formation of $SiH_3$ radicals. This is achieved easily using capacitive plasma deposition, due to the low plasma density and the incomplete dissociation of the film precursor gas. However, the deposition rate is very low. Favoring the formation of $SiH_3$ radicals is more complex to achieve with high-density plasmas, due to the extent of the dissociation of the film precursor gas. However, the use of high-density plasmas makes it possible to achieve a very high deposition rate.

The present invention is particularly concerned with distributed ECR technology (DECR), which is a technology developed to create high density, low temperature plasmas suitable for coating large area substrates. DECR technology is a direct dissociation technology, which means that the system uses a single chamber. In this technology, both dissociation of gaseous precursors and the deposition of radicals onto the substrate to form a film take place in this single chamber. Further details can be found, for example, in U.S. Pat. No. 6,407,359, corresponding to EP-A-1075168.

This technology is very different from classical divergent ECR, which is an indirect dissociation process. In divergent ECR technology, a plasma of He or hydrogen is created in a separate plasma chamber where the ECR plasma is ignited. This chamber is connected via an orifice to a deposition chamber to allow ions and neutral species to be transferred from one chamber into the other. Ions created within the plasma chamber travel along the magnetic lines from the plasma chamber to the substrate surface located in the deposition chamber. Silane, or other film precursor gas, is only injected in the deposition chamber, and is dissociated via reactions with ions, radicals and/or activated species created in the plasma chamber. This means that silane dissociation is indirect and is not due to collisions with hot electrons present in the ECR zone.

DECR possesses significant advantages compared to divergent ECR in terms of simplicity, scalability and capability to deposit homogeneous film over large surface. However, DECR, at least as currently practised, possesses some disadvantages as regards the deposition of high quality silicon films at high rate. One reason for this is as follows.

Because DECR uses a single deposition chamber, direct dissociation of silane by hot electrons created in the ECR zone leads to the creation of a mixture of radicals having very different levels of dissociation, for example $SiH_3$, $SiH_2$, $SiH$ and $Si$. $SiH_2$ for example is mainly produced not via $SiH_3$ dissociation but mostly by direct silane dissociation by a hot electron, with the creation of two atomic hydrogens.

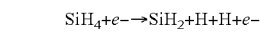

$SiH_4 + e^- \rightarrow SiH_2 + H + H + e^-$

The creation of $SiH_3$ can occur by direct electron dissociation.

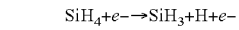

$SiH_4 + e^- \rightarrow SiH_3 + H + e^-$ but also, and mainly, via silane reaction with atomic hydrogen:

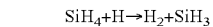

$SiH_4 + H \rightarrow H_2 + SiH_3$

Thus, in a DECR reactor a mixture of radicals is created having very different mobilities at the film surface. Highly dissociated radicals like $Si$, $SiH$ or even $SiH_2$, are not as mobile as $SiH_3$ and may not have time to rearrange at the surface of growing film, due to the large deposition rate, leading to the deposition of a defective film when working at too low substrate temperature. For this reason, it is desirable to promote deposition from $SiH_3$ radicals to assist in obtaining a high quality material, even during deposition at low temperature. However, although favoring $SiH_3$ radical formation is relatively easy to achieve in a divergent ECR configuration, it has been found to be more difficult to achieve using the DECR technology.

An object of the present invention is to address this problem and deposit a high quality silicon film at high rate and possibly low substrate temperature, this film being deposited mainly from highly mobile $SiH_3$ precursors.

According to the present invention there is provided a method of depositing film of an amorphous or microcrystalline material from a plasma on to a substrate, wherein microwave energy is introduced into a chamber as a sequence of discrete microwave pulses, a film precursor gas is introduced into the chamber as a sequence of discrete gas pulses, and gas for generating atomic hydrogen is supplied to the chamber at least during each microwave pulse, each microwave pulse being followed in non-overlapping fashion with a precursor gas pulse, and each precursor gas pulse being followed by a period during which there is neither a microwave pulse nor a precursor gas pulse.

In a preferred embodiment of the invention a continuous flow of hydrogen is fed into the DECR reactor. Microwave power is pulsed to the DECR antennas, creating alternate ignition and extinction of the hydrogen plasma. The silane (film precursor gas) is injected during the off-pause of the plasma and only during this phase, so that the silane flow is pulsed with the pulsing of the microwaves. Doing this, during the ON phase of the microwave pulse, the reactor is mainly fed with hydrogen, and microwave power allows $H_2$ dissociation into two atomic hydrogens:

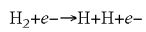

The residence time of the electrons being extremely short, much shorter than the atomic hydrogen residence time, no direct silane dissociation takes place during the OFF phase of the microwave pulse. On the contrary, the hydrogen present will react with the pulse of silane to create mainly $SiH_3$ precursors that will deposit at the surface of the substrate. To increase the deposition rate, the silane is preferably injected near the substrate while hydrogen is preferably injected in the ECR zones.

The range of pulsing frequency and the duty cycle are mainly defined by the residence time of the species in the reactor. The timelength of the zero silane flow (period between the end of silane pulse and the beginning of microwave pulse) must be long enough to ensure that most of the silane molecules will be dissociated or evacuated from the reactor before switching on the microwave power. This minimizes the direct dissociation of silane, which is not desired in the present case. On the contrary, the length of the silane pulse should preferably not be longer than the atomic hydrogen residence time because any silane injected for a period longer than the atomic hydrogen residence time will lead to undissociated silane and so to the loss of valuable raw material.

Figure 1:
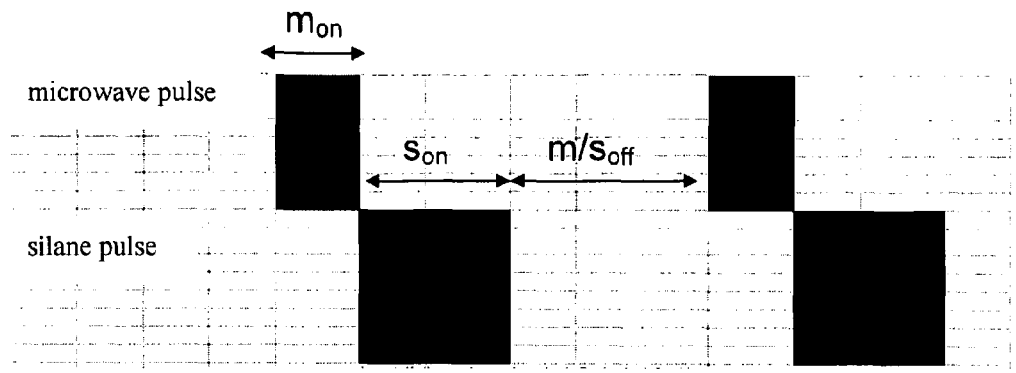
FIG. 1 is a diagram which shows the criteria to be used for defining the pulse frequency and duty cycle for the microwaves and silane flow.
Figure 2:
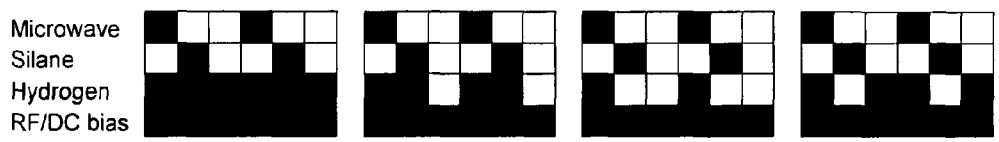
FIG. 2 is a diagram showing four options where the flow of hydrogen is continuous or pulsed, and a constant bias is applied to the substrate.
Figure 4:
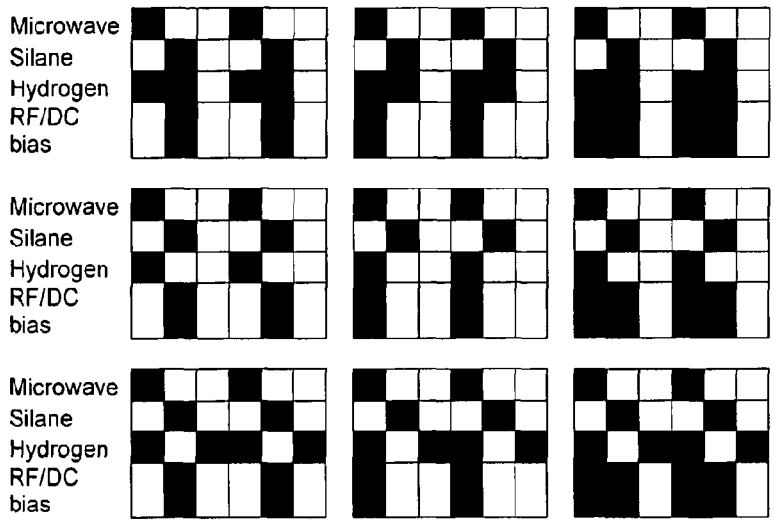
FIG. 4 is a diagram showing six options where the flow of hydrogen and the bias are both pulsed.

Referring to FIG. 1, it will be seen that the pulse cycle consists of a period $m_{on}$ when the microwave power is on, a non-overlapping (though, in this case, contiguous) period $s_{on}$ when silane, or other film precursor gas is being introduced, and a period $m/s_{off}$ when the microwave power is off and silane is not introduced. If the frequency of the microwave and silane flow pulses are equal, their duty cycles may be different to optimize the deposition. Hydrogen may be introduced throughout all three periods. Alternatively, however, the flow of hydrogen could also be pulsed, as shown in FIGS. 2 and 4, provided that hydrogen is introduced at least during each microwave pulse.

The time $m_{on}$ is determined by the capability of the plasma pulse to generate atomic hydrogen. Typically its length is from 0.1 ms to 1 s.

The time $s_{on}$ is determined by the length of time for which the atomic hydrogen generated by the preceding microwave pulse continues to be present in the reactor, so as to be available to react with the silane. This will be the shorter of the lifetime of the atomic hydrogen (before it is converted into molecular hydrogen, or other molecules including hydrogen) and the residence time of the hydrogen (before it can be pumped out of the chamber). Under the conditions of very low pressure which are preferably used in DECR reactors, the lifetime of atomic hydrogen is very short, and is likely to be much shorter than residence time, in a reactor of typical size, in which case it is the former which will then determine how long the period $s_{on}$ should be. Of course, it is not essential that $s_{on}$ should precisely equal the lifetime of atomic hydrogen, but the more nearly it does so the more efficient will be the formation of the desirable $SiH_3$ radicals.

$m/s_{off}$ is determined by the length of time taken to evacuate from the reactor the silane, and those gaseous species which have been generated from the silane but not deposited on the substrate. This will vary depending on reactor size and pumping rate, but typically $m/s_{off}$ should be of the order of 30 ms, and, more generally, from 1 ms to 100 ms.

The frequency of the microwave pulses and silane pulses will typically be from 1 Hz to 30 kHz, more preferably from 1 Hz to 10 kHz, most preferably from 1 Hz to 250 Hz.

Figure 3:
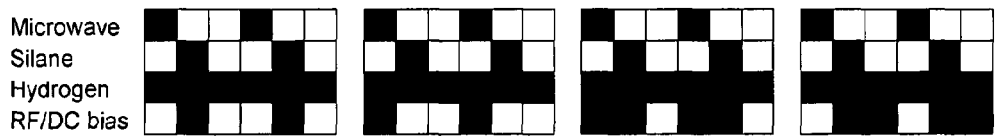
FIG. 3 is a diagram showing four options where the flow of hydrogen is continuous, and the bias is pulsed.

A bias voltage is preferably applied to the substrate to assist deposition. Where the substrate is non-conductive, for example glass, DC bias voltage develops on the substrate surface using an RF voltage source. Further discussion of this is to be found in our copending application filed on the same date as the present application and entitled "Method for forming a film of amorphous silicon by deposition from a plasma" (our reference G27558EP (European Patent Application No. 06301114.2)). If desired, the bias voltage can be pulsed, and some options for this are shown in FIGS. 3 and 4. If desired, the bias voltage can be pulsed in synchronisation with the microwave pulses, provided that the duration of the microwave pulses is not too short. Typically, synchronised pulsing is possible provided the microwave pulses are not shorter than about 30 ms. The minimum microwave pulse time which permits such synchronisation is determined by the time constant of the system which comprises the plasma reactor and the generator applying the RF voltage.

In the above description it has been assumed that molecular hydrogen is the gas which is introduced into the chamber in order to generate atomic hydrogen. However, at least under some circumstances some other gas can be used for this purpose. For example, if the film to be produced is SiC the carbon for the film and the atomic hydrogen could both be derived by introducing a gas which contained carbon and hydrogen, for example methane. Similarly an SiN film could be produced by using ammonia.

The invention claimed is:

1. A method of depositing film of an amorphous or microcrystalline material from a plasma on to a substrate, the method comprising:
   introducing microwave energy into a chamber as a sequence of discrete microwave pulses,
   introducing a film precursor gas into the chamber as a sequence of discrete gas pulses, and
   supplying a gas for generating atomic hydrogen to the chamber at least during each microwave pulse,
   each microwave pulse being followed in non-overlapping fashion with a precursor gas pulse, and each precursor gas pulse being followed by a period during which there is neither a microwave pulse nor a precursor pulse, and
   wherein the atomic hydrogen formed during the microwave pulse reacts with the precursor gas during the precursor gas pulses and
   wherein there is no direct electron dissociation of the precursor gas during the period where there is no microwave pulse.

2. The method of according to claim 1, wherein each precursor gas pulse is contiguous in time to the preceding microwave pulse.

3. The method of according to claim 1, wherein the gas for generating atomic hydrogen is molecular hydrogen.

4. The method of according to claim 1, wherein the film material is amorphous silicon.

5. The method of according to claim 1, wherein the film material is microcrystalline silicon.

6. The method of according to claim 1, wherein the film material is an alloy of silicon and another element, and wherein the gas for generating atomic hydrogen is a compound comprising hydrogen and that other element.

7. The method of according to claim 1, wherein a bias voltage is applied to the substrate to assist deposition.

8. The method of according to claim 7, wherein the bias voltage is applied continuously.

9. The method of according to claim 7, wherein the bias voltage is pulsed.

10. The method of according to claim 1, wherein the input of gas for generating atomic energy is pulsed.

11. The method of according to claim 1, wherein the plasma is generated by distributed electron cyclotron resonance.

12. The method of according to claim 4, wherein the gas for generating atomic hydrogen is molecular hydrogen.

13. The method of according to claim 4, further comprising the step of applying a bias voltage to the substrate to assist deposition.

14. The method of according to claim 4, wherein the input of the gas for generating atomic hydrogen is pulsed.

15. The method of according to claim 4, wherein the plasma is generated by distributed electron cyclotron resonance.

* * * * *